United States Patent
Miller

(12) 
(10) Patent No.: US 6,700,520 B1
(45) Date of Patent: Mar. 2, 2004

(54) MULTI-BIT CONTINUOUS TIME SIGMA-DELTA ADC

(75) Inventor: Matthew Miller, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 30 days.

(21) Appl. No.: 10/244,317

(22) Filed: Sep. 16, 2002

(51) Int. Cl.$^7$ .............................................. H03M 3/00
(52) U.S. Cl. ........................ 341/143; 341/144; 341/155
(58) Field of Search ................................ 341/143, 155, 341/144

(56) References Cited

U.S. PATENT DOCUMENTS

| | | | | |
|---|---|---|---|---|
| 4,215,311 A | * | 7/1980 | Kittel et al. | 375/216 |
| 6,057,791 A | * | 5/2000 | Knapp | 341/122 |
| 6,292,121 B1 | * | 9/2001 | Cake et al. | 341/143 |
| 6,304,608 B1 | * | 10/2001 | Chen et al. | 375/252 |

OTHER PUBLICATIONS

Ravindranath Naiknaware, Haiming Tang, and Terri S. Fiez. "Time–Referenced Single–Path Multi–Bit ΔΣ ADC using a VCO–Based Quanitzer." IEEE Transcations on Circuits and Systems—II: Analog and Digital Signal Processing, vol. 47, No. 7, Jul. 2000.

Atsushi Iwata, Noboru Sakimura, Makoto Nagata, and Takashi Morie. "The Architecture of Delta Sigma Analog–to–Digital Converters Using a Voltage–Controlled Oscillator as a Multibit Quantizer." IEEE Transactions on Circuits and Systems—II: Analog and Digital Signal Processing, vol. 46, No. 7, Jul. 1999.

Rex T. Baird, and Terri S. Fiez. "Linearity Enhancement of Multibit ΔΣ A/D and D/A Converters Using Data Weighted Averaging." IEEE Transactions on Circuits and Systems—II: Analog and Digital Signal Processing, vol. 42, No. 12, Dec. 1995.

Mats Hovin, Alf Olsen, Tor Sverre Lande, and Chris Toumazou. "Delta–Sigma Modulators Using Frequency–Modulated Intermediate Values." IEEE Journal of Solid–State Circuits, vol. 32, No. 1, Jan. 1997.

* cited by examiner

*Primary Examiner*—Peguy Jean Pierre
(74) *Attorney, Agent, or Firm*—Kenneth A. Haas

(57) ABSTRACT

A multi-bit continuous-time sigma-delta analog-to-digital converter provides a digital output signal as a digital representation of an analog input signal. The converter performs several functions in providing the digital output signal. First, the converter provides an analog summing signal indicative of a summation of the analog input signal and an analog feedback signal. Second, the converter provides a first set of bits as a digital representation of the analog summation signal. Third, the converter provides a second set of bits as a digital representation of a periodic sampling of the first set of bits. Fourth, the converter provides the analog feedback signal as an analog representation of the second set of bits. Fifth, the converter outputs the first set of bits or the second set of bits as the digital output signal.

15 Claims, 4 Drawing Sheets

| OS | B₁ | B₂ | B₃ | B₄ | B₅ | B₆ | B₇ | B₈ | CLK | SB₁ | SB₂ | SB₃ | SB₄ | SB₅ | SB₆ | SB₇ | SB₈ |
|---|---|---|---|---|---|---|---|---|---|---|---|---|---|---|---|---|---|
|  | 0 | 0 | 0 | 0 | 0 | 0 | 0 | 0 |  | 0 | 0 | 0 | 0 | 0 | 0 | 0 | 0 |
| 1 | 1 | 0 | 0 | 0 | 0 | 0 | 0 | 0 |  | 0 | 0 | 0 | 0 | 0 | 0 | 0 | 0 |
| 2 | 1 | 1 | 0 | 0 | 0 | 0 | 0 | 0 |  | 0 | 0 | 0 | 0 | 0 | 0 | 0 | 0 |
| 3 | 1 | 1 | 1 | 0 | 0 | 0 | 0 | 0 |  | 0 | 0 | 0 | 0 | 0 | 0 | 0 | 0 |
| 4 | 1 | 1 | 1 | 1 | 0 | 0 | 0 | 0 | 1 | 1 | 1 | 1 | 1 | 0 | 0 | 0 | 0 |
| 5 | 1 | 1 | 1 | 1 | 1 | 0 | 0 | 0 |  | 1 | 1 | 1 | 1 | 0 | 0 | 0 | 0 |
| 6 | 1 | 1 | 1 | 1 | 1 | 1 | 0 | 0 |  | 1 | 1 | 1 | 1 | 0 | 0 | 0 | 0 |
| 7 | 1 | 1 | 1 | 1 | 1 | 1 | 1 | 0 |  | 1 | 1 | 1 | 1 | 0 | 0 | 0 | 0 |
| 8 | 1 | 1 | 1 | 1 | 1 | 1 | 1 | 1 | 2 | 0 | 0 | 0 | 0 | 1 | 1 | 1 | 1 |
| 9 | 0 | 1 | 1 | 1 | 1 | 1 | 1 | 1 |  | 0 | 0 | 0 | 0 | 1 | 1 | 1 | 1 |
| 10 | 0 | 0 | 1 | 1 | 1 | 1 | 1 | 1 |  | 0 | 0 | 0 | 0 | 1 | 1 | 1 | 1 |
| 11 | 0 | 0 | 0 | 1 | 1 | 1 | 1 | 1 |  | 0 | 0 | 0 | 0 | 1 | 1 | 1 | 1 |
| 12 | 0 | 0 | 0 | 0 | 1 | 1 | 1 | 1 | 3 | 1 | 1 | 1 | 1 | 0 | 0 | 0 | 0 |
| 13 | 0 | 0 | 0 | 0 | 0 | 1 | 1 | 1 |  | 1 | 1 | 1 | 1 | 0 | 0 | 0 | 0 |
| 14 | 0 | 0 | 0 | 0 | 0 | 0 | 1 | 1 | 4 | 0 | 0 | 0 | 0 | 1 | 1 | 0 | 0 |
| 15 | 0 | 0 | 0 | 0 | 0 | 0 | 0 | 1 |  | 0 | 0 | 0 | 0 | 1 | 1 | 0 | 0 |
| 16 | 0 | 0 | 0 | 0 | 0 | 0 | 0 | 0 | 5 | 0 | 0 | 0 | 0 | 0 | 0 | 1 | 1 |
| 17 | 1 | 0 | 0 | 0 | 0 | 0 | 0 | 0 |  | 0 | 0 | 0 | 0 | 0 | 0 | 1 | 1 |
| 18 | 1 | 1 | 0 | 0 | 0 | 0 | 0 | 0 |  | 0 | 0 | 0 | 0 | 0 | 0 | 1 | 1 |
| 19 | 1 | 1 | 1 | 0 | 0 | 0 | 0 | 0 |  | 0 | 0 | 0 | 0 | 0 | 0 | 1 | 1 |
| 20 | 1 | 1 | 1 | 1 | 0 | 0 | 0 | 0 | 6 | 1 | 1 | 1 | 1 | 0 | 0 | 0 | 0 |
| 21 | 1 | 1 | 1 | 1 | 1 | 0 | 0 | 0 |  | 1 | 1 | 1 | 1 | 0 | 0 | 0 | 0 |
| 22 | 1 | 1 | 1 | 1 | 1 | 1 | 0 | 0 |  | 1 | 1 | 1 | 1 | 0 | 0 | 0 | 0 |
| 23 | 1 | 1 | 1 | 1 | 1 | 1 | 1 | 0 |  | 1 | 1 | 1 | 1 | 0 | 0 | 0 | 0 |
| 24 | 1 | 1 | 1 | 1 | 1 | 1 | 1 | 1 |  | 1 | 1 | 1 | 1 | 0 | 0 | 0 | 0 |
| 25 | 0 | 1 | 1 | 1 | 1 | 1 | 1 | 1 |  | 1 | 1 | 1 | 1 | 0 | 0 | 0 | 0 |
| 26 | 0 | 0 | 1 | 1 | 1 | 1 | 1 | 1 | 7 | 1 | 1 | 0 | 0 | 1 | 1 | 1 | 1 |
| 27 | 0 | 0 | 0 | 1 | 1 | 1 | 1 | 1 |  | 1 | 1 | 0 | 0 | 1 | 1 | 1 | 1 |
| 28 | 0 | 0 | 0 | 0 | 1 | 1 | 1 | 1 |  | 1 | 1 | 0 | 0 | 1 | 1 | 1 | 1 |
| 29 | 0 | 0 | 0 | 0 | 0 | 1 | 1 | 1 |  | 1 | 1 | 0 | 0 | 1 | 1 | 1 | 1 |
| 30 | 0 | 0 | 0 | 0 | 0 | 0 | 1 | 1 |  | 1 | 1 | 0 | 0 | 1 | 1 | 1 | 1 |
| 31 | 0 | 0 | 0 | 0 | 0 | 0 | 0 | 1 |  | 1 | 1 | 0 | 0 | 1 | 1 | 1 | 1 |
| 32 | 0 | 0 | 0 | 0 | 0 | 0 | 0 | 0 | 8 | 0 | 0 | 1 | 1 | 1 | 1 | 1 | 1 |

*FIG. 4*

MULTI-BIT CONTINUOUS TIME SIGMA-DELTA ADC

FIELD OF THE INVENTION

The present invention generally relates to the field of analog-to-digital converters ("ADC"). More specifically, the present invention relates to multi-bit quantizers in sigma-delta modulators.

BACKGROUND OF THE INVENTION

A primary advantage of continuous-time sigma-delta ADC devices over discrete-time multi-bit sigma-delta ADC devices is reduced power dissipation. At the same time, a primary advantage of discrete-time multi-bit sigma-delta ADC devices over single-bit sigma-delta ADC devices is the increased resolution that can be achieved at lower sampling rates. As such, there is motivation in the art to apply multi-bit quantizer technology to a continuous-time sigma-delta ADC structure. However, multi-bit quantizer technology can be expensive in terms of power consumption and circuit area when applied to sigma-delta ADC devices. The reason for this is that multi-bit quantizers are made up of banks of low offset comparators, while a single-bit sigma delta ADC device requires only a single comparator with a non-critical offset specification. The power penalty is most significant in the context of continuous-time sigma-delta ADC devices, because the primary motivation for implementing a continuous-time sigma-delta ADC device is to reduce power.

The present invention advances the art by a contribution of a novel multi-bit continuous-time sigma-delta ADC structure that addresses the aforementioned power penalty associated with a multi-bit quantizer.

SUMMARY OF THE INVENTION

The present invention is an analog-to-digital converter comprising a summing module, a voltage controlled oscillating module, a dynamic element matching module and a feedback module. In a base form, the summing module is operated to provide an analog summation signal indicative of a summation of an analog input signal and an analog feedback signal. The voltage controlled oscillating module is operated to provide a first set of bits as a digital representation of the analog summation signal. The dynamic element matching module is operated to provide a second set of bits as a digital representation of a periodic sampling of the first set of bits. And, the feedback module is operated to provide the analog feedback signal as an analog representation of the second set of bits.

The foregoing form as well as other forms, features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

BRIEF DESCRIPTION OF THE DRAWINGS

FIG. 4 illustrates a TABLE 1 listing an exemplary operation of FIG. 2 ADC.

DETAILED DESCRIPTION OF THE PRESENTLY PREFERRED EMBODIMENTS

Figure 1:
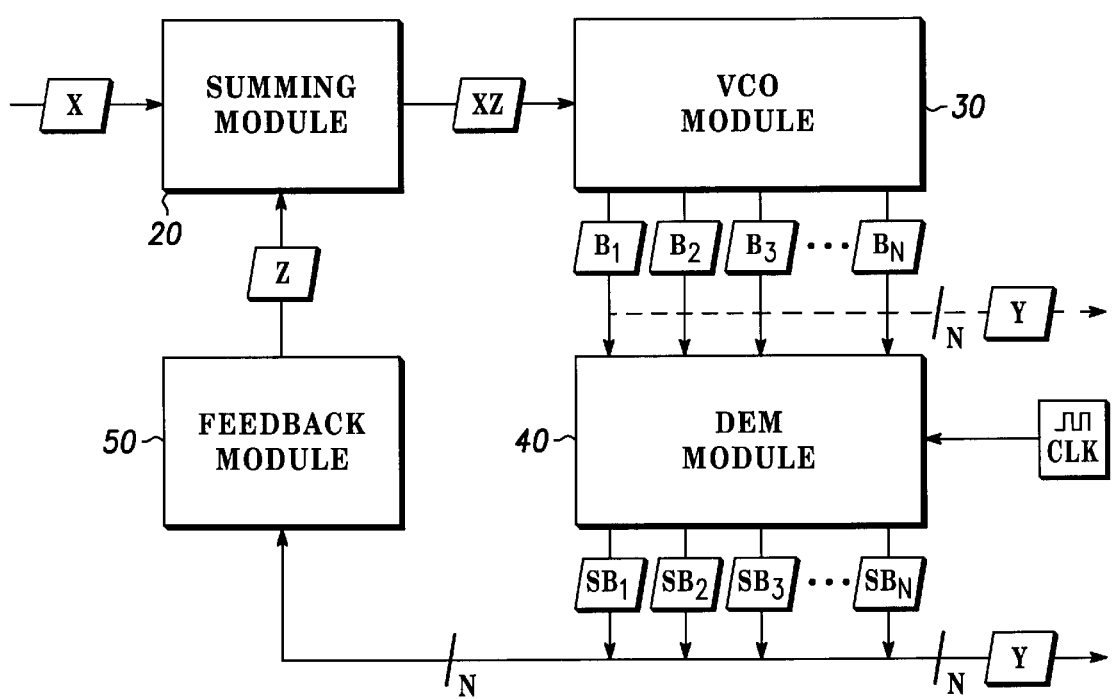
FIG. 1 illustrates an ADC of present invention.

FIG. 1 illustrates an ADC 10 of the present invention. ADC 10 comprises a summing module 20, a voltage controlled oscillating module 30 ("VCO module 30") dynamic element matching module 40 ("DEM module 40"), and a feedback module 50. Summing module 20 receives an analog input signal X, and is in communication with the feedback module 50 to thereby receive an analog feedback signal Z. The VCO module 30 is in communication with summing module 20 to thereby receive an analog summation signal XZ indicative of a summation of the analog input signal X and the analog feedback signal Z.

The DEM module 40 is in communication with the VCO module 30 to thereby receive a set of bits $B_1-B_N$ serving as a digital representation of the analog summation signal XZ. The DEM module 40 also receives a sampling clock CLK. The feedback module 50 is in communication with the DEM module 40 to thereby receive a set of sample bits $SB_1-SB_N$ serving as a digital representation of a periodic sampling of the bits $B_1-B_N$ in accordance with the sampling clock CLK. The sample bits $SB_1-SB_N$ form a digital output signal Y composed of N bits. Alternatively, the bits $B_1-B_N$ form the digital output signal Y composed of N bits.

Figure 2:
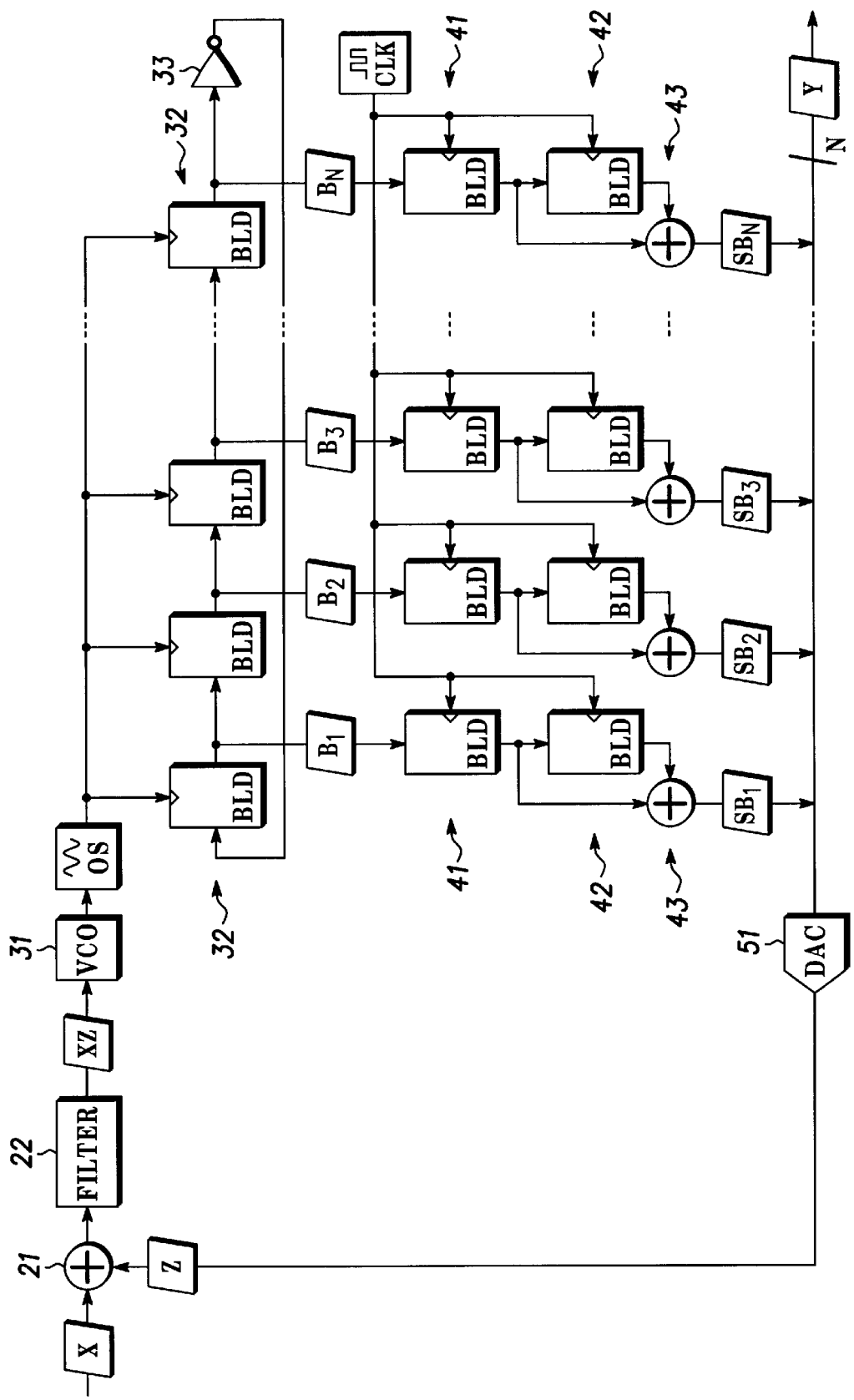
FIG. 2 illustrates a first embodiment of the FIG. 1 ADC.
Figure 3:
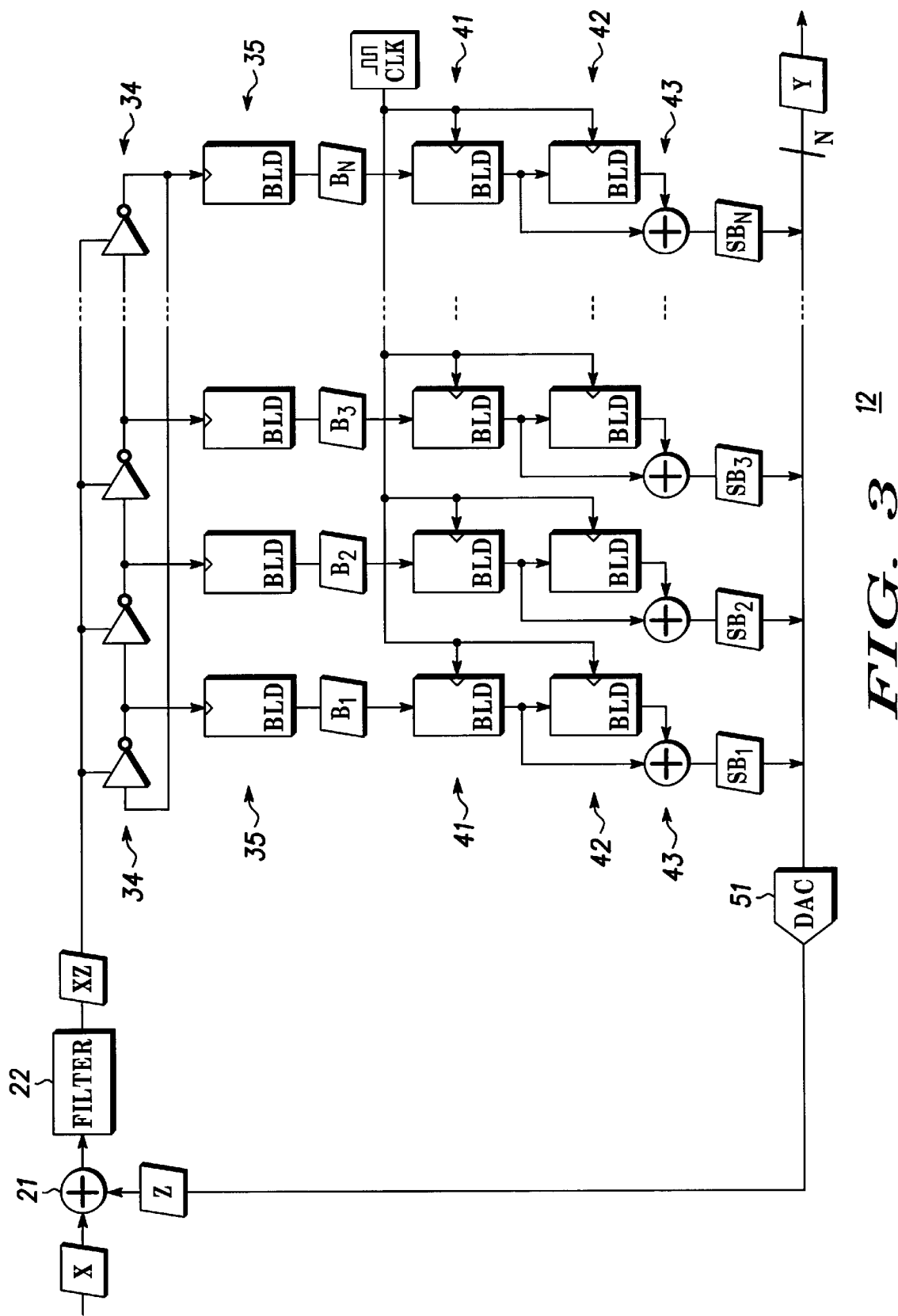
FIG. 3 illustrates a second embodiment of the FIG. 1 ADC.

Each component of ADC 10 may employ hardware (analog or digital), software, or any combination of hardware and software. Additionally, the communication between the various components of ADC 10 can be accomplished in numerous ways (e.g., electrically, optically, magnetically, and/or acoustically). The number of embodiments of ADC 10 is therefore essentially limitless. FIGS. 2 and 3 illustrate an ADC 11 and an ADC 12, respectively, as preferred embodiments of the ADC 10.

As illustrated in FIG. 2, the ADC 11 includes a conventional summer 21 and a conventional filter 22 collectively constituting one embodiment of summing module 20 (FIG. 1). The summer 21 sums the analog input signal X and the analog feedback signal Z to thereby provide the analog summation signal XZ. The filter 22 filters the analog summation signal XZ.

The ADC 11 further includes a conventional voltage controlled oscillator 31 and a feedback shift register 32 collectively constituting one embodiment of VCO module 30 (FIG. 1). The voltage controlled oscillator 31 generates an oscillating signal OS as a function of a magnitude of the analog summation signal XZ. The feedback shift register 32 has a Nth quantity of conventional bi-stable latching devices ("BLD"), where $1 \leq N \leq \infty$. Each BLD has a clock input for receiving the oscillating signal OS. A data output of each BLD is communicated to a data input of a succeeding BLD with the exception of a data output of the Nth BLD being communicated to a data input of an inverter 33 and a data output of the inverter 33 being communicated to a data input of the first BLD. The data outputs of the BLD are the bits $B_1-B_N$, respectively, which are a function of a frequency of the oscillating signal OS.

The ADC 11 further includes a row 41 of an Nth quantity of BLD, a row 42 of an Nth quantity of BLD, and a row 43 of an Nth quantity conventional summers collectively constituting one embodiment of DEM module 40 (FIG. 1), where $1 \leq N \leq \infty$. Each BLD of row 41 has data input in communication with a data output of a corresponding BLD of register 32, and a clock input for receiving the sampling clock CLK. Each BLD of row 42 has data input in communication with a data output of a corresponding BLD of row 41, and a clock input for receiving the sampling clock CLK.

Each summer of row 43 receives the data outputs of a corresponding BLD of row 41 and a corresponding BLD of row 42. The data outputs of the summers of row 43 are sample bits $SB_1$–$SB_N$, respectively, which are a function of the sampling clock CLK and the bits $B_1$–$B_N$.

The ADC 11 further includes a digital-to-analog converter 51 ("DAC 51") constituting one embodiment of feedback module 50 (FIG. 1). The DAC 51 has an input in communication with each summer of row 43 to thereby input the sample bits $SB_1$–$SB_N$ and an output in communication with the summer 21 to thereby provide the analog feedback signal Z to summer 21.

As illustrated in FIG. 3, the ADC 12 is an alternative version of the ADC 11 that includes a voltage controlled ring oscillator in lieu of the VCO 31 (FIG. 2) and the feedback shift register (FIG. 2). The voltage controlled ring oscillator includes a row 34 of an Nth quantity of conventional inverters and a row 35 of an Nth quantity of BLD (e.g., toggle flip-flops), N can be any odd number between one and infinity. Each inverter of row 34 has a supply input for receiving the analog summation signal XZ. A data output of each inverter of row 34 is communicated to a data input of a succeeding inverter with the exception of a data output of the Nth inverter being communicated to a data input of the first inverter. Each BLD of row 35 has a clock input in communication with a data output of a corresponding inverter of row 34, and a data output in communication with a data input of a corresponding BLD of row 41. The corresponding bits $B_1$–$B_N$ are a function of a magnitude of the analog summation signal XZ.

An operation of ADC 11 (FIG. 2) where N=8 will now be described herein. In operation, the analog summation signal XZ applied to the input of the VCO 31 will deviate above and below its nominal value. When the analog summation signal XZ is at its nominal value, the oscillating signal OS will have an operating frequency 4× the sampling frequency of the sampling clock CLK. When the analog summation signal XZ is greater than its nominal value, the operating frequency of the oscillating signal OS will increase to a value greater than 4× the sampling frequency of the sampling clock CLK. When the analog summation signal XZ is less than its nominal value, the operating frequency of the oscillating signal OS will decrease to a value less than 4× the sampling frequency of the sampling clock CLK.

To facilitate a further understanding of the operation of ADC 11, FIG. 4 illustrates a TABLE 1 based on N=8, and a frequency of sampling clock CLK being nominally ¼$^{th}$ the frequency of the oscillating signal OS. In TABLE 1, an initial state of the bits $B_1$–$B_N$ and sample bits $SB_1$–$SB_N$ is 00000000. Each time the feedback shift register 32 is clocked by the oscillating signal OS during clock cycles 1–8, the state of feedback shift register 32 changes with each successive bit becoming a logical 1 until feedback shift register 32 state becomes 11111111 at clock cycle 8. After that, clock cycles 9–16 cause successive bits of feedback shift register 32 to become a logical 0 until feedback shift register 32 returns to its initial state of 00000000 at clock cycle 16. This sequence is repeated for clock cycles 17–32 and so on and so on. When the operating frequency of the oscillating signal OS equals its nominal frequency, then half of the bits $B_1$–$B_N$ will change state within a single clock cycle of the sampling clock CLK as indicated by clock cycles 1, 2, 3 and 6 of the sampling clock CLK illustrated in TABLE 1. When operating frequency of the oscillating signal OS is less than its nominal frequency, then less than half of the bits $B_1$–$B_N$ will change state as indicated by clock cycles 4 and 5 of the sampling clock CLK illustrated in TABLE 1. Conversely, when operating frequency of the oscillating signal OS is greater than its nominal frequency, then more than half of the bits $B_1$–$B_N$ will change state as indicated by clock cycles 7 and 8 of the sampling clock CLK illustrated in TABLE 1.

At the end of a sampling clock period of the sampling clock CLK, the current state of the bits $B_1$–$B_N$ is stored in the row 41 of BLD and the previous state of the bits $B_1$–$B_N$ is stored in the row 42 of BLD. The row 43 of summers compares the current state and the previous state of bits $B_1$–$B_N$ whereby an output of the row 43 of summers consists of an N bit word. Each digits of the N bit word having a value of logical 1 indicates the number of bits $B_1$–$B_N$ that changed state within the last sampling clock period of the sampling clock CLK. In TABLE 1, eight (8) clock cycles of the sampling clock CLK are illustrated.

At the end of the clock cycle 1 of the sampling clock CLK, bits $B_1$–$B_4$ have changed state whereby the value of bits $B_1$–$B_8$ is 11110000 and the value of sample bits $SB_1$–$SB_8$ is 11110000.

At the end of the clock cycle 2 of the sampling clock CLK, bits $B_5$–$B_8$ have changed state whereby the value of bits $B_1$–$B_8$ is 11111111 and the value of sample bits $SB_1$–$SB_8$ is 00001111.

At the end of the clock cycle 3 of the sampling clock CLK, bits $B_1$–$B_4$ have changed state whereby the value of bits $B_1$–$B_8$ is 00001111 and the value of sample bits $SB_1$–$SB_8$ is 11110000.

At the end of the clock cycle 4 of the sampling clock CLK, bits $B_5$ and $B_6$ have changed state whereby the value of bits $B_1$–$B_8$ is 00000011 and the value of sample bits $SB_1$–$SB_8$ is 00001100.

At the end of the clock cycle 5 of the sampling clock CLK, bits $B_7$ and $B_8$ have changed state whereby the value of bits $B_1$–$B_8$ is 00000000 and the value of sample bits $SB_1$–$SB_8$ is 00000011.

At the end of the clock cycle 6 of the sampling clock CLK, bits $B_1$–$B_4$ have changed state whereby the value of bits $B_1$–$B_8$ is 11110000 and the value of sample bits $SB_1$–$SB_8$ is 11110000.

At the end of the clock cycle 7 of the sampling clock CLK, bit $B_1$, bit $B_2$, and bits $B_5$–$B_8$ have changed state whereby the value of bits $B_1$–$B_8$ is 00111111 and the value of sample bits $SB_1$–$SB_8$ is 11001111.

At the end of the clock cycle 8 of the sampling clock CLK, bits $B_3$–$B_8$ have changed state whereby the value of bits $B_1$–$B_8$ is 00000000 and the value of sample bits $SB_1$–$SB_8$ is 0011111.

From the preceding description of the exemplary operation of ADC 11, those having ordinary skill in the art will appreciate an operation of ADC 12.

The present invention may be embodied in other specific forms without departing from its spirit or essential characteristics. For example, the mathematical principles of linearity and superposition may enable the re-ordering of certain steps of the described embodiments, or may enable additional specific embodiments having essentially the same function, and such variations are within the scope of the present invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

I claim:

1. An analog-to-digital converter, comprising:
   a summing module operable to provide an analog summation signal indicative of a summation of an analog input signal and an analog feedback signal;
   a voltage controlled oscillating module operable to provide a first set of bits as a digital representation of the analog summation signal;
   a dynamic element matching module operable to provide a second set of bits as a digital representation of a periodic sampling of the first set of bits; and
   a feedback module operable to provide the analog feedback signal as an analog representation of the second set of bits.

2. The analog-to-digital converter of claim 1, wherein said summing module includes:
   a summer operable to provide the analog summation signal in response to a reception of the analog input signal and the analog feedback signal; and
   a filter operable to filter the analog summation signal.

3. The analog-to-digital converter of claim 1, wherein said voltage controlled oscillating module includes:
   a voltage controlled oscillator operable to provide an oscillation signal as a function of a magnitude of the analog summation signal; and
   a feedback shift register operable to provide the first set of bits as a function of a frequency of the oscillation signal.

4. The analog-to-digital converter of claim 1, wherein said voltage controlled oscillating module includes a ring oscillator operable to provide the first set of bits as a function of a magnitude of the analog summation signal.

5. The analog-to-digital converter of claim 1, wherein said dynamic element matching module is further operable to latch the second set of bits as a function of a sampling frequency.

6. The analog-to-digital converter of claim 1, wherein said dynamic element matching module is further operable to generate the second set of bits as a function of a summation of at least two samples of the first set of bits.

7. The analog-to-digital converter of claim 1,
   wherein said voltage controlled oscillating module provides the first set of bits at an oscillating frequency;
   wherein said dynamic element matching module provides the second set of bits at a sampling frequency; and
   wherein the second set of bits are indicative of the oscillating frequency relative to the sampling frequency.

8. The analog-to-digital converter of claim 1, wherein said dynamic element matching module includes means for latching the second set of bits as a function of a sampling frequency.

9. The analog-to-digital converter of claim 1, wherein said dynamic element matching module includes means for generating the second set of bits as a function of a summation of at least two samples of the first set of bits.

10. A method of providing a digital output signal as a digital representation of an analog input signal, said method comprising:
    inputting the analog input signal;
    providing an analog summation signal indicative of a summation of the analog input signal and an analog feedback signal;
    providing a first set of bits as a digital representation of the analog summation signal;
    providing a second set of bits as a digital representation of a periodic sampling of the first set of bits; and
    providing the analog feedback signal as an analog representation of the second set of bits.

11. The method of claim 10, further comprising:
    outputting the first set of bits as the digital output signal.

12. The method of claim 10, further comprising:
    outputting the second set of bits as the digital output signal.

13. The method of claim 10,
    wherein the first set of bits are provided at an oscillating frequency;
    wherein the second set of bits are provided at a sampling frequency; and
    wherein the second set of bits are indicative of the oscillating frequency relative to the sampling frequency.

14. The method of claim 10, further comprising:
    latching the second set of bits as a function of a sampling frequency.

15. The method of claim 10, further comprising:
    generating the second set of bits as a function of a summation of at least two samples of the first set of bits.

* * * * *